United States Patent [19]
Weiss

[11] Patent Number: 5,298,363
[45] Date of Patent: Mar. 29, 1994

[54] PHOTOLITHOGRAPHICALLY PATTERNED FLUORESCENT COATING

[75] Inventor: Armin K. Weiss, Rochester, N.Y.

[73] Assignee: Eastman Kodak Company, Rochester, N.Y.

[21] Appl. No.: 716,462

[22] Filed: Jun. 17, 1991

[51] Int. Cl.5 .................................................. G03C 5/56
[52] U.S. Cl. .................................. 430/296; 430/322; 430/325; 430/326
[58] Field of Search ............... 430/270, 296, 322, 325, 430/326

[56] References Cited

U.S. PATENT DOCUMENTS

| | | | |
|---|---|---|---|
| 4,262,206 | 4/1981 | Viehmann | 250/483 |
| 4,577,098 | 3/1986 | Ogawa | 250/216 |
| 4,605,489 | 8/1986 | Madgavkar | 208/87 |
| 4,743,530 | 5/1988 | Farid | 430/281 |
| 4,906,552 | 3/1990 | Ngo | 430/312 |

OTHER PUBLICATIONS

Viehmann et al, SPIE vol. 279, "Ultraviolet and Vacuum Ultraviolet Systems" pp. 146–152 (1981).
Stuart et al, SPIE vol. 331, "Instrumentation in Astronomy IV" pp. 52–68 (1982).

Primary Examiner—Marion E. McCamish
Assistant Examiner—Kathleen Duda
Attorney, Agent, or Firm—William W. Holloway

[57] ABSTRACT

Fluorescent patterns are provided registratively oriented on a support by coating a liquid precursor of a photolithographically patternable composition, containing fluorescent compounds, on said support and patternwise exposing and developing the coating on the support.

19 Claims, 4 Drawing Sheets

PHOTOLITHOGRAPHICALLY PATTERNED FLUORESCENT COATING

FIELD OF THE INVENTION

The present invention relates to forming fluorescent patterns in a polymeric organic coating on a support.

BACKGROUND OF THE INVENTION

Fluorescent compounds and their applications are well known. For example, a group of organic fluorescent compounds generally referred to as coumarins, or another group generally referred to as rhodamines, are used at relatively low concentration in a suitable solvent in so-called dye-laser applications. Fluorescent compounds also find application as optical brighteners in fabrics and papers. Fluorescent compounds are also employed as radiation converters in medical radiology and as scintillation agents for detecting low level radiation.

In the above applications, fluorescent compounds are more or less uniformly dissolved, dispersed, imbibed or deposited in the liquid, or in or on the article, such as a fabric fiber or paper stock.

More recently, the use of fluorescent compounds dissolved in polymeric, organic, film-forming materials has been reported. In U.S. Pat. No. 4,262,206 by W. Viehmann is disclosed a fluorescent radiation converter, comprising a more or less uniform coating on a substantially transparent support of a polymeric material containing a fluorescent compound.

Other applications of unpatterned fluorescent coatings relate to their use in conjunction with solid-state radiation-sensing elements, such as silicon-based photovoltaic sensors or charge-coupled devices (CCD). Here, the unpatterned fluorescent, polymeric coating is applied more or less uniformly on an individual device for the purpose of extending the responsivity of the device to a spectral region or wavelength range where the native, uncoated device has little or no response to incident radiation.

Such applications of unpatterned, fluorescent polymeric coatings over radiation-sensitive elements are disclosed in: U.S. Pat. No. 4,605,849 by P. O. Kliem; W. Viehmann, et al, SPIE Vol. 279, "Ultraviolet and Vacuum Ultraviolet Systems", pages 146–152 (1981); F. E. Stuart, et al, SPIE Vol. 331, "Instrumentation in Astronomy IV", pages 52–68 (1982), and references contained therein.

U.S. Pat. No. 4,577,098 by K. Ogawa discloses a solid-state imager with inorganic fluorescent elements. Patterned fluorescent elements are inferred, but no teaching is provided about the patterning of such inorganic fluorescent elements.

SUMMARY OF THE INVENTION

In accordance with this invention it has been discovered that fluorescent patterns can be formed in a coating by photolithographic methods, using polymeric organic coating precursors and organic fluorescent compounds.

It is an object of the present invention to provide fluorescent patterns in a polymeric organic coating on a support.

A further object of this invention is to provide fluorescent patterns registratively oriented in relationship to registration features in or on said support.

Another object of this invention is to provide registratively oriented fluorescent patterns as radiation converters simultaneously on a support comprising at least two radiation-sensing elements.

A still further object of this invention is to provide registratively oriented fluorescent patterns as substantially lateral optical conduits on a substantially non-scattering support.

These objects of the present invention are achieved in a method of photolithographically patterning a polymeric organic coating on a support, said coating containing fluorescent organic compounds, comprising the steps of:

(a) forming a coating containing fluorescent organic compounds on a support;

(b) providing a registratively oriented, patternwise exposure to said coating, so as to cause a patternwise, chemical reaction in the coating, thereby rendering the fluorescent coating patternwise developable; and (c) developing the patternwise exposed fluorescent coating to provide fluorescent patterns registratively oriented in relationship to features on said support.

An advantage of this invention is that a multiplicity of fluorescent patterns can be formed simultaneously on the support.

An additional advantage of this invention is that the deposition and patternwise exposure and patternwise development of the fluorescent coating is achieved with equipment and procedures commonly employed in established photolithographic processing facilities.

Another advantage of this invention is that either positive-working or negative-working, photolithographically patternable, polymeric organic coating precursors can be selected to contain fluorescent organic compound.

A further advantage of this invention is that different fluorescent compounds can be incorporated in each successive coating, if successive coatings are required.

It has been discovered that fluorescent patterns of high fidelity are achieved on a support by the photolithographic procedures of coating deposition from a liquid precursor, registratively patternwise exposure, and pattern development, of a polymeric organic coating containing fluorescent compounds, said exposure being selected so as to render the fluorescent coating patternwise developable.

BRIEF DESCRIPTION OF THE DRAWINGS

The present invention can be better appreciated by reference to the following preferred embodiments considered in conjunction with the drawings, in which.

MODES OF CARRYING OUT THE INVENTION

Figure 1:
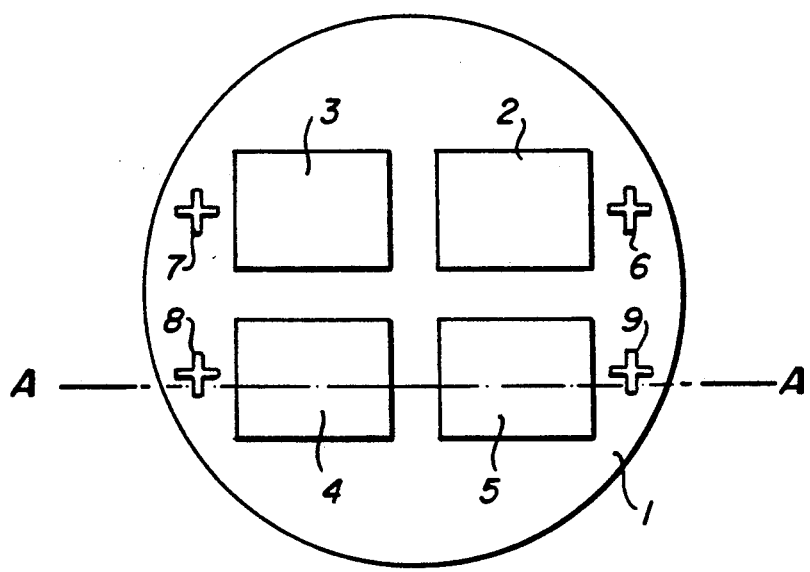
FIG. 1 is a plan view of a wafer-shaped support depicting four designated photoactive domains, each photoactive domain being associated with a registration feature.

In FIG. 1 a semiconductor wafer-shaped support 1 is shown with four designated photoactive domains 2, 3, 4 and 5. Associated with each designated photoactive domain is a registration feature, such registration features being 6, 7, 8 and 9. These registration features on or in support 1 will serve to registratively orient the subsequent patternwise exposure of a photolithographically patternable, fluorescent, polymeric organic coating to be deposited on support 1.

Figure 2A:
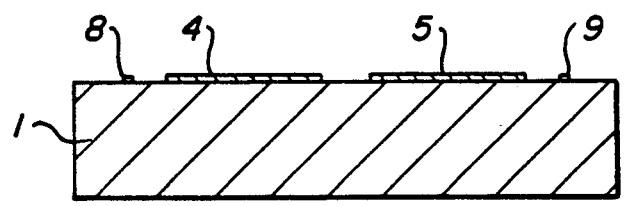
FIG. 2a is a cross-sectional view along line A—A in FIG. 1 of the wafer-shaped support.

FIG. 2a shows in cross-sectional view along line A—A in FIG. 1 the wafer-shaped support 1, designated photoactive domains 4 and 5 and portions of associated registration features 8 and 9.

Figure 2B:
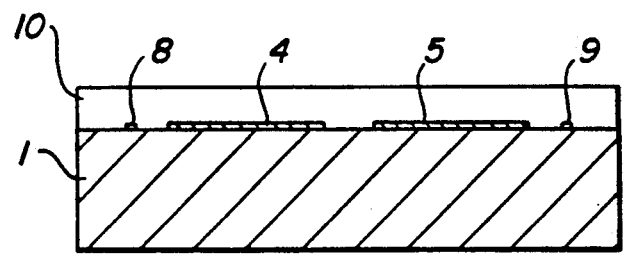
FIG. 2b shows, in cross-section, a polymeric organic coating containing a fluorescent compound, deposited uniformly on said support.

FIG. 2b depicts a uniformly applied coating 10 covering the surface of support 1 comprising designated photoactive domains 4 and 5, and associated registration features 8 and 9. Coating 10 is a polymeric organic composition containing uniformly dissolved fluorescent organic compounds, said coating having been applied to support 1 by spin-coating a liquid precursor.

Figure 2C:
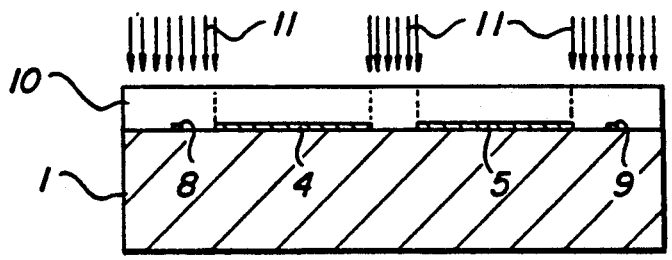
FIG. 2c depicts, in cross-section, the patternwise exposure of all areas of the fluorescent coating, with exception of areas coincident with the underlying designated photoactive domains on the support.

FIG. 2c provides patternwise incident exposure 11 on the free surface of coating 10, the patternwise exposure being directed at all areas of coating 10, with the exception of those areas of coating 10 that are coincident with underlying designated photoactive domains 4 and 5 on the support 1. Exposure 11 can be provided from any suitable source (not shown), such as a mercury vapor lamp, a laser, or an electron beam or ion beam system. Exposure 11 must be of sufficient energy to cause a chemical reaction in the exposed portions of coating 10, so as to render said coating patternwise developable. Typically, such energies are achieved by electron beam energies ranging from about 5 kev to about 25 kev or ultraviolet/blue radiation within the wavelength range of 220 nm to 450 nm. The patternwise definition of exposure 11 can be accomplished by means of a registratively oriented mask (not shown), comprising suitably arranged registration features and appropriately oriented transparent and opaque areas. Alternatively, patternwise definition of registratively oriented exposure 11 can be provided by suitably programmed scanning beams (not shown) from a laser source, electron beam source or ion beam source (not shown).

Figure 2D:
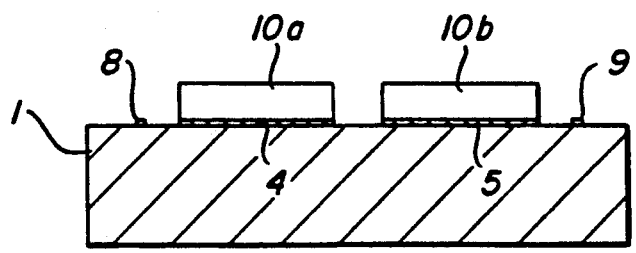
FIG. 2d is a cross-sectional view after pattern development, showing the remaining fluorescent pattern being coincident with the underlying photoactive domains on the support.

FIG. 2d indicates the cross-sectional view of FIG. 2c after patternwise development of the previously patternwise exposed coating 10. In FIG. 2d, coating area 10a is shown remaining registratively overlaid on designated photoactive domain 4, and coating area 10b is shown remaining registratively overlaid on designated photoactive domains 5. The other, previously exposed (see FIG. 2c) areas of coating 10 were removed from support 1 during the patternwise development step. Patternwise development may be carried out by means of suitable developing agents, said developing agents preferably being liquids. By definitions commonly used in photolithography work, removal by a developing agent of a previously exposed, and thus chemically changed, area of a photolithographic coating classifies said coating as a positive-working photolithographic coating.

Thus, the sequence of process steps depicted in FIGS. 2a–d, in conjunction with the materials used, results in fluorescent patterns registratively overlaid on designated domains of the support.

Figure 3A:
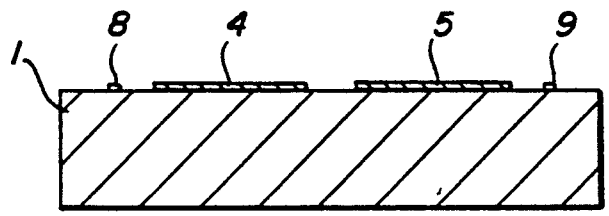
FIG. 3a is a cross-sectional view along line A—A in FIG. 1 of the wafer-shaped support.

In FIG. 3a is shown the cross-sectional view of the semiconductor wafer-shaped support 1, the cross-section being along line A—A of FIG. 1. Designated photoactive domains 4 and 5 and portions of associated registration features 8 and 9 are also indicated in FIG. 3a.

Figure 3B:
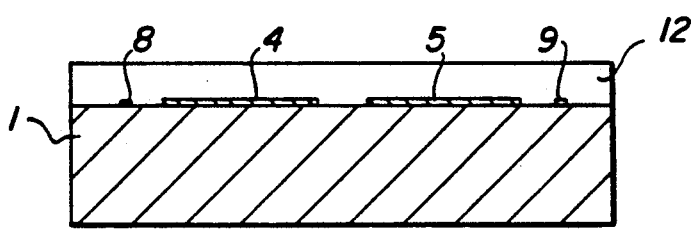
FIG. 3b shows, in cross-section, a polymeric organic coating containing a fluorescent compound, deposed uniformly on said support.

FIG. 3b depicts a uniformly applied coating 12 covering the surface of support 1 comprising the designated photoactive domains 4 and 5 and associated registration features 8 and 9. Coating 12 is a polymeric organic composition containing uniformly dissolved fluorescent organic compounds, said coating having been applied to support 1 by spin-coating a liquid precursor.

Figure 3C:
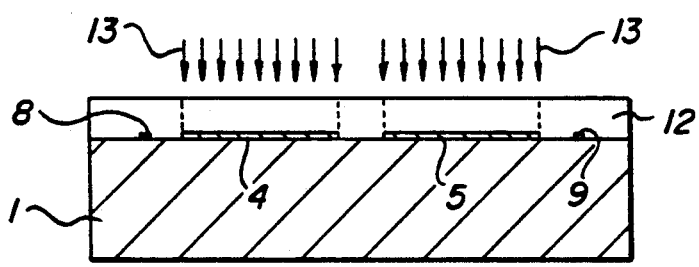
FIG. 3c depicts, in cross-section, the patternwise exposure of those areas of the fluorescent coating which are coincident with the underlying designated photoactive domains on the support.

FIG. 3c provides patternwise incident exposure 13 on the free surface of coating 12, the patternwise exposure being directed only at those areas of coating 12 that are coincident with underlying designated photoactive domains 4 and 5 on the support 1. Exposure 13 can be provided from any suitable source (not shown), such as a mercury vapor lamp or a laser. Exposure 13 must be of sufficient energy to cause a chemical reaction in the exposed portions of coating 12, so as to render said coating patternwise developable. Typically, such energies are achieved by ultraviolet/blue radiation within the wavelength range of 220 nm to 450 nm. The patternwise definition of exposure 13 can be accomplished by means of a registratively oriented mask (not shown) comprising suitably arranged registration features and appropriately oriented transparent and opaque areas. Alternatively, patternwise definition of registratively oriented exposure 13 can be provided by suitably programmed scanning beams (not shown) from a laser source.

Figure 3D:
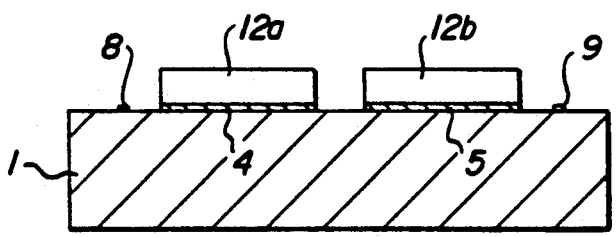
FIG. 3d is a cross-sectional view after pattern development, showing the remaining fluorescent pattern being coincident with the underlying designated photoactive domains on the support.

FIG. 3d indicates the cross-sectional view of FIG. 3c after patternwise development of the previously patternwise exposed coating 12. In FIG. 3d, coating area 12a is shown remaining registratively overlaid on designated photoactive domain 4, and coating area 12b is shown remaining registratively overlaid on designated photoactive domain 5. The other, previously unexposed (see FIG. 3c) areas of coating 12 were removed from support 1 during the patternwise development step. Patternwise development may be carried out by means of suitable developing agents, said developing agents preferably being liquids. By definitions commonly used in photolithography work, removal by a developing agent of a previously unexposed, and thus chemically unchanged, area of a photolithographic coating classifies said coating as a negative-working photolithographic coating.

Thus, the sequence of process steps depicted in FIGS. 3a–d, in conjunction with the materials used, results in fluorescent patterns registratively overlaid on designated domains of the support.

Figure 4A:
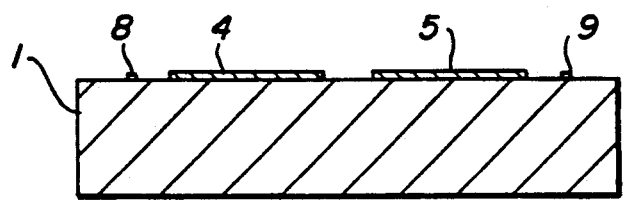
FIG. 4a is a cross-sectional view along line A—A in FIG. 1 of the wafer-shaped support.

FIG. 4a is a cross-sectional view along the line A—A of FIG. 1, comprising wafer-shaped support 1, designated photoactive domains 4 and 5 and portions of associated registration features 8 and 9.

Figure 4B:
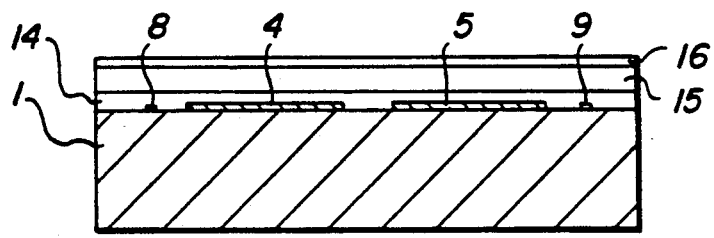
FIG. 4b shows, in cross-section, three successively applied polymeric organic coatings, with the lowermost and uppermost coating each containing one and the same fluorescent compound, and the middle coating containing a different fluorescent compound.

FIG. 4b shows successively applied, uniform coatings 14, 15 and 16, covering the surface of support 1 comprising the designated photoactive domains 4 and 5 and associated registration features 8 and 9. Coatings 14, 15, and 16 are polymeric organic compositions, with the lowermost coating 14 and the uppermost coating 16 each containing one and the same fluorescent compound, and the middle coating 15 containing different fluorescent compound(s). Each coating was applied by spin-coating its respective liquid precursor.

Figure 4C:
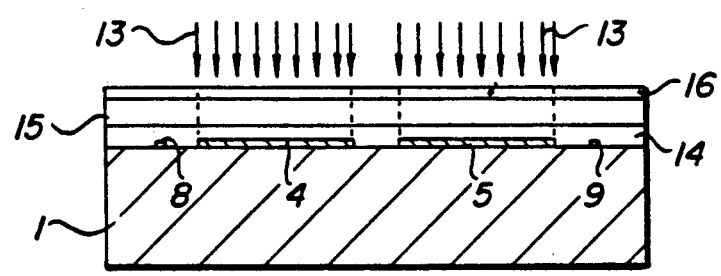
FIG. 4c depicts, in cross-section, the patternwise exposure of those areas of the fluorescent coatings which are coincident with the underlying designated photoactive domains on the support.

FIG. 4c provides patternwise incident exposure 13 on the free surface of coating 16, the patternwise exposure being directed only at those areas of coating 16, and at coincident areas in coating 15 and 14, respectively, that are coincident with underlying designated photoactive domains 4 and 5. Exposure 13 can be provided from any suitable source (not shown), such as a mercury vapor lamp or a laser. Exposure 13 must be of sufficient energy to cause a chemical reaction in the exposed portions of each of the coatings 14, 15 and 16, so as to render the said coatings patternwise developable. The patternwise definition of exposure 13 can be provided by means of a registratively oriented mask (not shown) comprising suitably arranged registration features and appropriately oriented transparent and opaque areas. Alternatively, patternwise definition of registratively oriented exposure 13 can be provided by suitably programmed scanning beams (not shown) from a laser source.

Figure 4D:
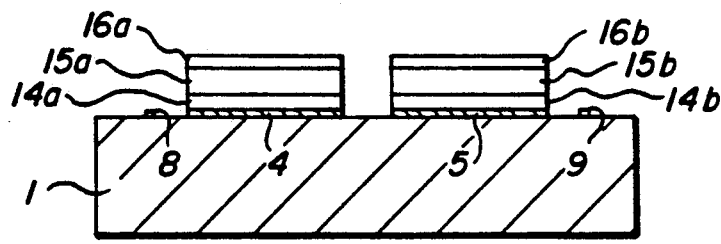
FIG. 4d is a cross-sectional view after pattern development, showing the remaining fluorescent pattern of the three-layer composite coating being coincident with the underlying designated photoactive domains on the support.

FIG. 4d gives the cross-sectional view of FIG. 4c after patternwise development of the previously patternwise exposed coatings 14, 15 and 16. In FIG. 4d, coating areas 14a, 15a and 16a are shown remaining, each being registratively overlaid on designated photoactive domain 4 of support 1. Coating areas 14b, 15b and 16b are shown remaining, each being registratively overlaid on designated photoactive domain 5 of support 1. The other, previously unexposed (see FIG. 4c) areas of coatings 14, 15, and 16 were removed from support 1 during the patternwise development step. Patternwise development may be carried out by means of suitable developing agents, said developing agents preferably being liquids. By definitions commonly used in photolithography work, removal of previously unexposed, and thus chemically unchanged areas of a photolithographic coating, or of successively applied coatings, classifies said coating or coatings as negative-working photolithographic coating or coatings.

Thus, the sequence of process steps depicted in FIGS. 4a–d, in conjunction with the materials used, results in fluorescent patterns registratively overlaid on designated domains of the support.

Figure 5:
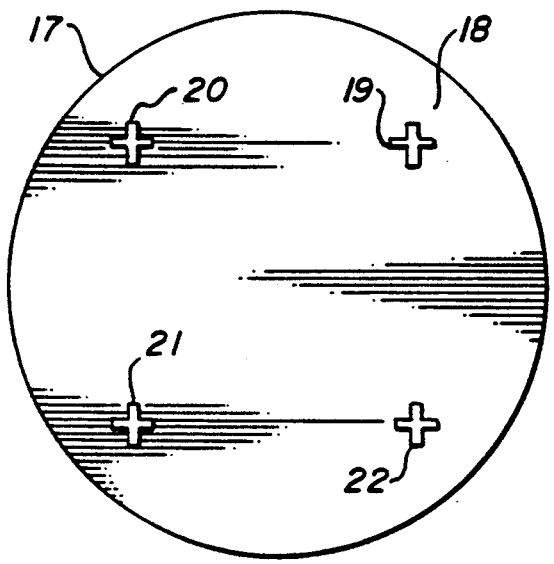
FIG. 5 is a plan view of a wafer-shaped support depicting four registration features and a vapor-deposited film.

In FIG. 5 a plan view of a wafer-shaped support 17 has registration features 19, 20, 21 and 22 on one surface. Overlying that surface is a vapor-deposited film 18 of an inorganic material having an optical refractive index value for visible light which is lower than the optical refractive index value of support 17, and lower than the optical refractive index value of a subsequently applied and photolithographically patterned polymeric organic coating containing fluorescent compounds. If, for example, the optical refractive index value is 1.5 for both, a glass wafer support 17 and a still to be applied and patterned fluorescent organic coating, then the optical refractive index value of vapor-deposited film 18 is preferable lower than or equal to 1.4. A film of vapor-deposited magnesium fluoride can have an optical refractive index value of between 1.3 and 1.4. By way of reference, air is assumed to have an optical refractive index value of 1.0.

Figure 6:
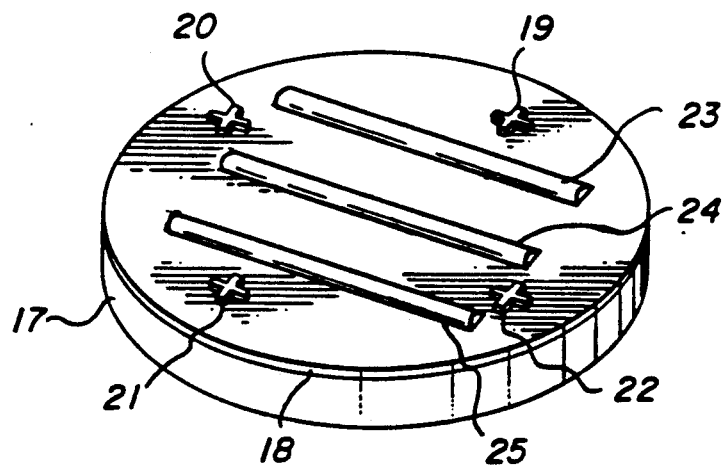
FIG. 6 is a perspective view of the wafer-shaped support of FIG. 5, containing on its upper surface a grouping of fluorescent line patterns.

FIG. 6 is a perspective view of the wafer-shaped support 17 of FIG. 5, after application and photolithographic patterning of a polymeric organic coating containing fluorescent compounds. Registration features 19, 20, 21 and 22 are shown on support 17, being covered by vapor-deposited film 18. Overlying film 18 is indicated a grouping of polymeric, organic, fluorescent patterned lines 23, 24 and 25, said lines having been patterned from a previously uniformly applied coating (not shown) by the photolithographic steps of registratively patternwise exposure and patternwise development, as described in reference to FIGS. 2a–d, 3a–d and 4a–d.

Functionally, fluorescent line patterns 23, 24 and 25 constitute lateral light pipes or lateral optical conduits, since light injected into, or generated within each line pattern will propagate preferentially along the directions of long dimension of each line pattern. Such preferential light propagation is thought to occur by multiple total internal reflections of light generated within, or injected into, each line pattern, said reflections taking place at the interfacial surfaces between the polymeric, organic, fluorescent lines and their respective immediate surrounds of lower-value optical refractive index, such as film 18 along the bottom of each line pattern and air along all other surfaces of each line pattern. Suitable optical coupling (not shown) can be provided, for example, at one end of each line, for detecting such laterally propagating light.

Thus, patterned fluorescent lines are provided, characterized by their length dimensions being at least 1000-fold larger than their width dimensions and height dimensions, said lines being registratively oriented on a support.

In practicing the invention of producing registratively oriented fluorescent patterns on a support by a photolithographic sequence of steps, several considerations are though to be relevant:

1. Pattern fidelity, that is the faithful replication in the fluorescent pattern of detail contained in the incident patternwise exposure, is achieved by providing a homogeneous coating from a liquid precursor. Homogeneous means specularly transmissive or non-scattering.

2. The addition of fluorescent compounds to photolithographically patternable compositions may require adjustment of the magnitude or level of the patternwise exposure incident on a patternable fluorescent coating. Adjustment of the pattern development step may also be required.

3. Photolithographically patternable compositions containing fluorescent compounds, and coatings of such compositions, must be substantially free of constituents or by-products capable of substantially inhibiting or poisoning the fluorescent performance of the fluorescent compounds contained in said composition or coating.

4. Even in the absence of constituents or by-products capable of substantially inhibiting or poisoning the fluorescent performance of fluorescent compounds contained in photolithographically patternable compositions, it has been observed that some fluorescent compounds exhibit reduced fluorescent performance in a patterned coating. This reduction in fluorescent performance is attributed to a known effect, referred to as "concentration quenching of fluorescence", said effect being related to the amount or level of a fluorescent compound in a coating composition. Accordingly, the amount or level of a fluorescent compound exhibiting such "concentration quenching of fluorescence" should be adjusted to minimize said effect. Alternatively, other fluorescent compounds can be selected which have lower or no "concentration quenching of fluorescence" when used in photolithographically patternable compositions at an amount or level of between about 0.05 and 15 weight percent, said weight percentages referring to the weight of the fluorescent compound relative to the weight of all non-volatile constituents of the photolithographically patternable composition. The preferred range of the amount or level of a single fluorescent compound in a photolithographically patternable composition is between about 0.1 and 5 weight percent.

A number of photolithographically patternable compositions are known, and are frequently referred to as "photoresists" by manufacturers and users alike. Examples of positive-working "photoresists" are novolak-based compositions, glutarimide-based compositions and acrylate-based compositions. Examples of negative-working "photoresists" are selected acrylate-based compositions, cyclized polyisoprene-based compositions, diazo resin-based compositions and polyvinyl-cinnamate-based compositions.

In the practice of the present invention, any of the known photolithographically patternable compositions ("photoresists") may be used, providing that the incorporation of fluorescent compounds into such compositions is consistent with the considerations 1, 2, 3 and 4 cited above.

Fluorescent organic compounds being soluble in a solvent or solvents of a liquid precursor of a photolithographically patternable composition can be selected, for example, from among the following groups of fluorescent organic compounds, providing that such selections are consistent with the considerations 1, 2, 3 and 4 cited above. These groups and other useful groups of fluorescent compounds are described in "The Chemistry of Synthetic Dyes", Volume 5, 1971, edited by K. Venkataraman and published by Academic Press. Chapter VIII of that reference is particularly relevant to groups of fluorescent compounds useful in the present invention.

Coumarin compounds, such as purified, laser-grade compounds,
7-Diethylamino-4-methylcoumarin
3-(2'-Benzothiazolyl)-7-diethylaminocoumarin
3-(2'Benzimidazolyl)-7-N,N-diethylaminocoumarin and
7-Dimethylamino-4-trifluoromethylcoumarin
Rhodamine compounds, such as purified, laser-grade compounds,
Rhodamine B; Rhodamine 6G;
Rhodamine 101 Inner Salt;
and Rhodamine 110, these designations being used in Catalog No. 54 of Laboratory Chemicals (1990) by Eastman Kodak Company.
Pyran Compounds, such as purified, laser-grade compounds,
4-(Dicyanomethylene)-2-(methyl)-6-(julolidylethenylene)-4H-pryan;
4-(Dicyanomethylene)-2-(methyl)-6-(julolidyltetramethylethenylene)-4H-pyran;
4-(Dicyanomethylene)-2-(methyl)-6-(julolidyltetramethylmethoxyethenylene)-4H-pyran; and
4-(Dicyanomethylene)-2-(methyl)-6-(p-dimethylaminostyryl)-4H-pyran.
Polynuclear fluorescent compounds, including: benzoxasoles, such as 2-(4-biphenylyl)-6-phenylbenzoxasole;
oxadiazoles, such as 2-(4-biphenylyl)-5-(p-tert-butylphenyl)-1,3,4-oxadizole;
and stilbenes, such as tetraphenylbutadiene.

Combinations of compounds selected from the above groups of fluorescent compounds are also useful in the practice of the present invention.

EXAMPLE 1

To 100 gram of a 9% solution of polymethyl methacrylate in chlorobenzene solvent was added 0.3 gram of 3-(2'Benzimadazolyl)-7-N,N-diethylaminocoumarin fluorescent compound. A homogenous solution was obtained after four hours of stirring. A wafer-shaped support was placed on a rotatable platen of a spin-coating apparatus in such a manner that the above solution could be applied to the support surface containing designated photoactive domains and associated registration features. After spin-coating at 4000 rpm for 60 seconds, the coating and support were baked at 150° C. for 60 seconds, resulting in a coating thickness of about 2 micrometer. A quartz mask, comprising registration features and suitably positioned opaque and transmissive areas, was registratively oriented in relationship to registration features on the support. The fluorescent coating was exposed through the transmissive areas of the mask to radiation from a defocused beam of an excimer laser at a wavelength of about 250 nm. The patternwise exposed coating was patternwise developed on the support by rotating the support at about 500 rpm on the spin-coating apparatus for about 30 seconds, while continuously directing a stream of toluene solvent at the coating. Following the 30 second patternwise development step, the coating was dried by spinning at 4000 rpm for 30 seconds, followed by a bake step at 150° C. for 60 seconds. Previously, patternwise exposed areas of the coating were removed from the support by the patternwise development step, leaving fluorescent areas registratively overlaid on the designated photoactive domains of the support.

EXAMPLE 2

To 50 grams of a 11% solution of polydimethylglutarimide in cylopentanone and diethylene glycol monomethyl ether solvents was added 0.5 gram of 7-diethylamino-4-methylcoumarin, 0.5 gram 3-(2'-benzimidazolyl)-7-N,N-diethylamino coumarin, 0.1 gram 3-(2'-benzothiazolyl)-7-diethylamino coumarin and 0.01 gram of rhodamine 101 inner salt fluorescent compounds. A homogenous solution resulted after 30 minutes of stirring. A wafer-shaped support with designated photoactive domains and associated registration features was coated with the above solution in a spin-coating apparatus at 1800 rpm for about 10 seconds. The coating and support were baked at 220° C. for 30 seconds, resulting in a coating thickness of about 1.3 micrometer. A quartz mask, comprising registration features and suitably positioned opaque and transmissive areas, was registratively oriented in relationship to registration features on the support. The fluorescent coating was exposed through the transmissive areas of the mask to radiation from a mercury vapor lamp, providing radiation in the wavelength range from about 220 nm to about 450 nm. The patternwise exposed coating was patternwise developed by immersion into a tetramethylammonium-based aqueous developer for 150 seconds, followed by a water rinse for 15 seconds and spin-drying at 3000 rpm for 45 seconds. Previously patternwise exposed areas of the coating were removed from the support by the patternwise development step, leaving fluorescent areas registratively overlaid on the designated photoactive domains of the support.

EXAMPLE 3

Example 2 was repeated, using a glass wafer as a support, the coated side containing registration features A quartz mask, comprising registration features and opaque lines about 10 micrometers wide and about 50 millimeter long, separated from one another by transmissive areas, was registratively oriented in relationship to the registration features on the support. A pattern of fluorescent lines was obtained on the support.

EXAMPLE 4

A negative-working photolithographic patternable composition was formulated by dissolving 12 gram of polymethylmethacrylate and 9 gram of dipentaerythritol monohydroxypentaacrylate in 84 grams of chlorobenzene solvent. To that composition was added 0.5 gram of 2-(4-biphenylyl)-5-(p-tert-butylphenyl)-1,3,4-oxadizole fluorescent compound, 1 gram of 7-diethylamino-4-methylcoumarin fluorescent compound, 0.5 gram of 3-(2'-benzimidazolyl)-7-N,N-diethylaminocoumarin fluorescent compound, and 0.05 gram of 4-(dicyanomethylene)-2-(methyl)-6-(p-dimethylaminostyrl)-4H-pyran fluorescent compound A homogeneous solution resulted after about 8 hours of stirring. A wafer-shaped solid-state image sensor having a plurality of designated photoactive domains and associated registration features was coated with the above composition containing fluorescent compounds at 2000 rpm for 60 seconds on a spin-coating apparatus. The uniformly applied coating on the support was baked at 135° C. for 60 seconds, resulting in a thickness of about 2.2 micrometers. A quartz mask, comprising registration features and suitably positioned transmissive and opaque areas, was registratively oriented in relationship to registration features on the support. The fluorescent coating was exposed through the transmissive areas of the mask to radiation from a mercury vapor lamp, providing radiation in the wavelength range from about 330 nm to about 450 nm. The patternwise exposed coating was patternwise developed on the support by rotating the support at about 500 rpm on the spin-coating apparatus for about 15 seconds, while continuously directing a stream of xylene solvent at the coating. The coating was then spin-dried at 4000 rpm for 30 seconds and baked at 135° C. for 60 seconds. Previously unexposed areas of the coating were removed from the support by the patternwise development step, leaving fluorescent areas registratively overlaid on the designated photoactive domains of the support.

EXAMPLE 5

Two negative-working photolithographically patternable compositions A and B were formulated, and different fluorescent compounds were added to each composition:

Composition A: 12 gram of polymethyl methacrylate and 9 gram of dipentaerythritol monohydroxypenta acrylate were dissolved in 84 gram of chlorobenzene solvent. To that composition was added 1.5 gram of the coumarin fluorescent compound 2,3,6,7-Tetrahydro-1,1,7,7-tetramethyl 11-oxo-1H,5H,11H-(1) benzopyrano (5,7,8-ij) quinolizine-10-carboxylic acid ethyl ester, also referred to as coumarin 504T.

Composition B: 12 gram of polymethyl methacrylate and 9 gram of dipentaerythritol monohydroxypenta acrylate were dissolved in 190 gram of chlorobenzene solvent. To this composition was added 0.1 gram of rhodamine 6G fluorescent compound.

A multi-layer coating assembly was prepared on a wafer-shaped solid-state image sensor having a plurality of designated photoactive domains and associated registration features: The first coating on the support was of Composition B, spin-coated at 3000 rpm for 30 seconds, and baked at 135° C. for 120 seconds. The second coating, uniformly overlying said first coating, was of composition A, spin-coated at 4000 rpm for 30 seconds, and baked at 135° C. for 120 seconds. A third coating, uniformly overlying said second and first coatings, was again of Composition B, spin-coated at 5000 rpm for 30 seconds, and baked at 135° C. for 60 seconds. This multi-layer coating was patternwise exposed and developed as in Example 4, resulting in removal of previously unexposed areas from the support, and leaving fluorescent areas registratively overlaid on the designated photoactive domains of the support.

The invention has been described in detail with particular reference to certain preferred embodiments thereof, but it will be understood that variations and modifications can be effected within the spirit and scope of the invention.

I claim:
1. A method of lithographically patterning a coating on a support, such coating containing fluorescent organic compounds, comprising the steps of:
 (a) forming a coating containing fluorescent organic compounds on a support;
 (b) providing a patternwise exposure to said coating registratively oriented in relationship to features on said support, so as to cause a patternwise chemical reaction in the coating, thereby rendering the fluorescent coating patternwise developable; and
 (c) developing the patternwise exposed fluorescent coating to provide fluorescent patterns registratively oriented in relationship to features on said support.

2. A method of lithographically patterning a coating of a polymeric, organic, radiation-sensitive lithographic composition on a support, such coating containing fluorescent organic compounds, comprising the steps of:
  (a) forming a coating of a polymeric, organic, radiation-sensitive lithographic composition containing fluorescent organic compounds on a support;
  (b) providing a patternwise exposure to said coating registratively oriented in relationship to features on said support, so as to cause a patternwise chemical reaction in the coating, thereby rendering the fluorescent coating patternwise developable; and
  (c) developing the patternwise exposed fluorescent coating to provide fluorescent patterns registratively oriented in relationship to features on said support.

3. The method of claim 2, wherein the polymeric, organic, radiation-sensitive lithographic composition is a positive-working photolithographic composition.

4. The method of claim 3, wherein the patternwise exposure is to radiation within the wavelength range from about 220 nm to about 450 nm.

5. The method of claim 3, wherein the patternwise exposure is to electrons within an energy range from about 5 keV to about 25 keV.

6. The method of claims 4 or 5, wherein the polymeric, organic, radiation-sensitive lithographic composition is selected from the group consisting of methylmethacrylates, ethyl methacrylates, butyl methacrylates, methyl glutarimides and novolak resins.

7. The method of claim 2, wherein the polymeric, organic, radiation-sensitive lithographic composition is a negative-working radiation-sensitive lithographic composition.

8. The method of claim 7, wherein the patternwise exposure is to radiation within the wavelength range from about 330 nm to about 450 nm.

9. The method of claim 8, wherein the polymeric, organic, radiation-sensitive lithographic composition is selected from the group consisting of methyl methacrylates, ethyl methacrylates, butyl methacrylates, cyclized polyisoprenes, polyvinyl cinnamates and diazo resins.

10. The method of claim 2, wherein the radiation-sensitive lithographic composition contains fluorescent compounds selected from the group consisting of: coumarin fluorescent compounds, polynuclear fluorescent compounds, pyran fluorescent compounds and rhodamine fluorescent compounds.

11. The method of claim 10, wherein the radiation-sensitive lithographic composition is a positive-working radiation-sensitive lithographic composition.

12. The method of claim 11, wherein the patternwise exposure is to radiation within the wavelength range from about 220 nm to about 450 nm.

13. The method of claim 11, wherein the patternwise exposure is to electrons within an energy range from about 5 keV to about 25 keV.

14. The method of claim 12 or 13, wherein the polymeric, organic, radiation-sensitive lithographic composition is selected from the group consisting of methyl methacrylates, ethyl methacrylates, butyl methacrylates, methyl glutarimides and novolak resins.

15. The method of claim 10, wherein the radiation-sensitive lithographic composition is a negative-working radiation-sensitive lithographic composition.

16. The method of claim 15, wherein the patternwise exposure is to radiation within the wavelength range from about 330 nm to about 450 nm.

17. The method of claim 16, wherein the polymeric, organic, radiation-sensitive lithographic composition is selected from the group consisting of methyl methacrylates, ethyl methacrylates, butyl methacrylates, cyclized polyisoprenes, polyvinyl cinnamates and diazo resins.

18. The method of claim 2, wherein at least two successive coatings of a polymeric, organic, radiation-sensitive lithographic composition are applied to, and lithographically patterned on, a support, of said at least two coatings containing different fluorescent compounds.

19. The method of claim 2, wherein fluorescent line patterns are provided on a support, characterized by the length dimension of said lines being at least 1000-fold larger than the width and height dimensions, respectively, of said lines.

* * * * *